(12) United States Patent
Yang et al.

(10) Patent No.: US 11,869,846 B1
(45) Date of Patent: Jan. 9, 2024

(54) INTERPOSER ROUTING STRUCTURE AND SEMICONDUCTOR PACKAGE

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Sheng-Fan Yang, Hsinchu (TW); Hao-Yu Tung, Hsinchu (TW); Hung-Yi Chang, Hsinchu (TW); Wei-Chiao Wang, Hsinchu (TW); Yi-Tzeng Lin, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/312,599

(22) Filed: May 5, 2023

(30) Foreign Application Priority Data

Jan. 6, 2023 (TW) .................................. 112100517

(51) Int. Cl.
| | | |
|---|---|---|
| *H01L 23/538* | (2006.01) | |
| *H01L 25/18* | (2023.01) | |
| *H10B 80/00* | (2023.01) | |
| *H01L 23/00* | (2006.01) | |
| *H01L 25/065* | (2023.01) | |

(52) U.S. Cl.
CPC .......... *H01L 23/5386* (2013.01); *H01L 24/16* (2013.01); *H01L 25/18* (2013.01); *H10B 80/00* (2023.02); *H01L 25/0657* (2013.01); *H01L 2224/16225* (2013.01); *H01L 2225/06517* (2013.01); *H01L 2225/06565* (2013.01)

(58) Field of Classification Search
CPC ..... H01L 23/5386; H01L 24/16; H01L 25/18; H01L 25/0657; H01L 2224/16225; H01L 2224/06517; H01L 2224/06565; H10B 80/00
See application file for complete search history.

(56) References Cited

U.S. PATENT DOCUMENTS

| | | | | |
|---|---|---|---|---|
| 9,412,674 | B1* | 8/2016 | Kim | ........................ H01L 22/34 |
| 2014/0117552 | A1* | 5/2014 | Qian | ................... H01L 23/5383 |
| | | | | 257/E23.141 |
| 2014/0332966 | A1* | 11/2014 | Xiu | ........................ H01L 23/293 |
| | | | | 257/773 |

\* cited by examiner

*Primary Examiner* — Timor Karimy
(74) *Attorney, Agent, or Firm* — CKC & Partners Co., LLC

(57) ABSTRACT

An interposer routing structure includes a first trace layer, a bump layer, a second trace layer and a third trace layer. The first trace layer is configured to receive a power. The bump layer is coupled to a die. The second trace layer and the third trace layer are coupled between the first trace layer and the bump layer, and include multiple ground traces and multiple power traces. The ground traces are located on both sides of at least one of the power traces, so that the ground traces isolate the at least one power trace and multiple signal traces. The power traces of the second trace layer are coupled to each other by a connecting power trace, and the ground traces of the third trace layer are coupled to each other by a connecting ground trace.

20 Claims, 8 Drawing Sheets

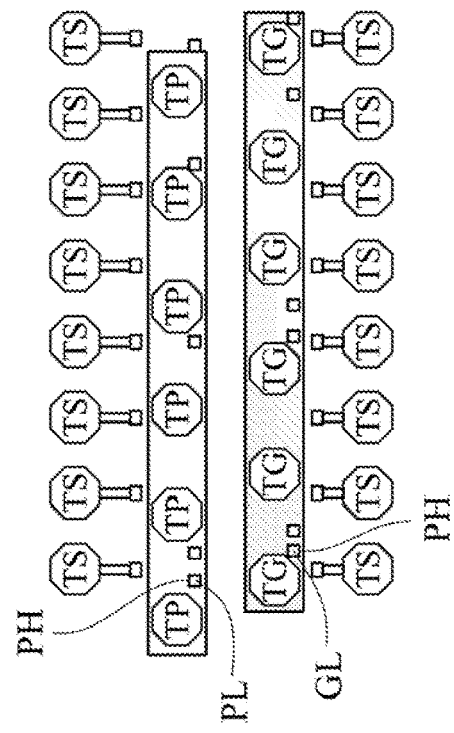
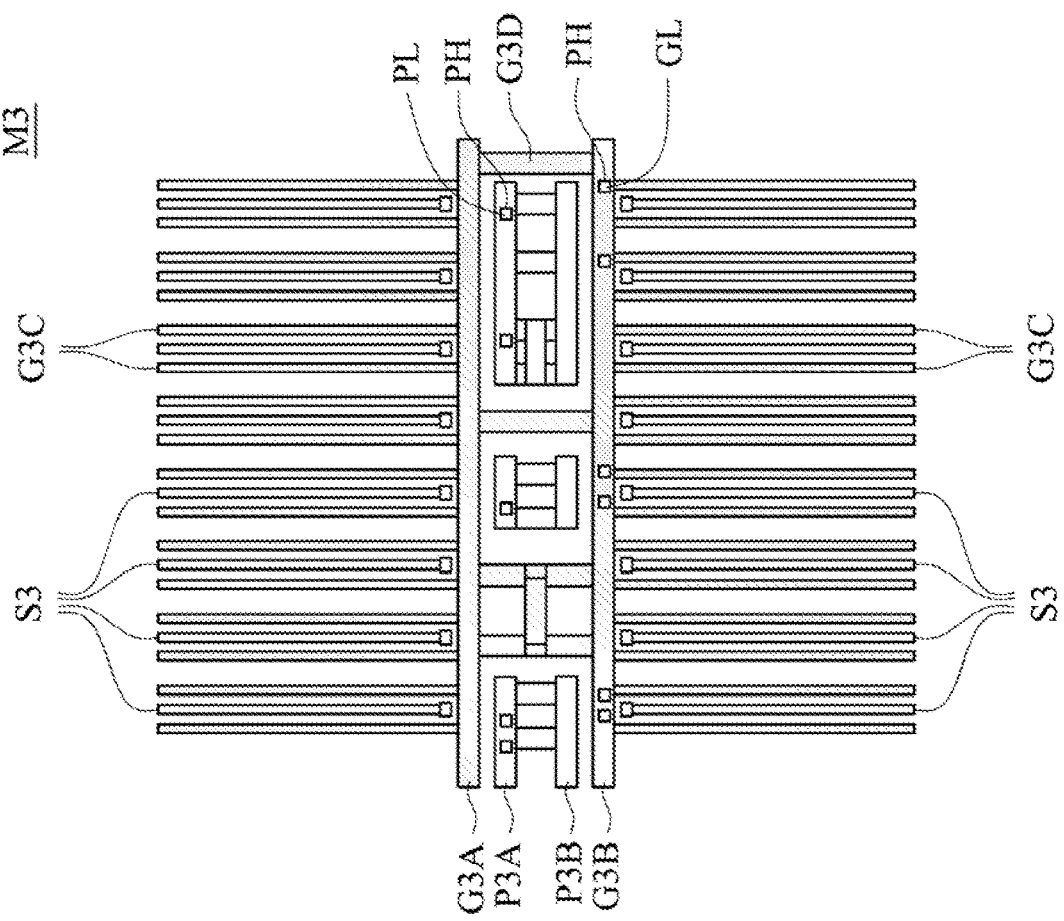
Fig. 2C
Fig. 2D

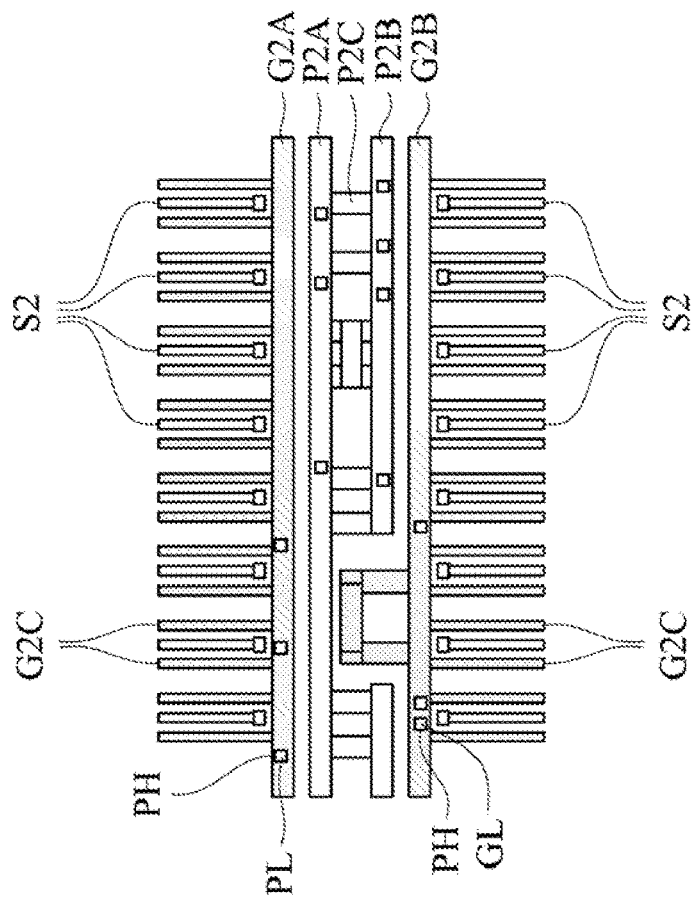
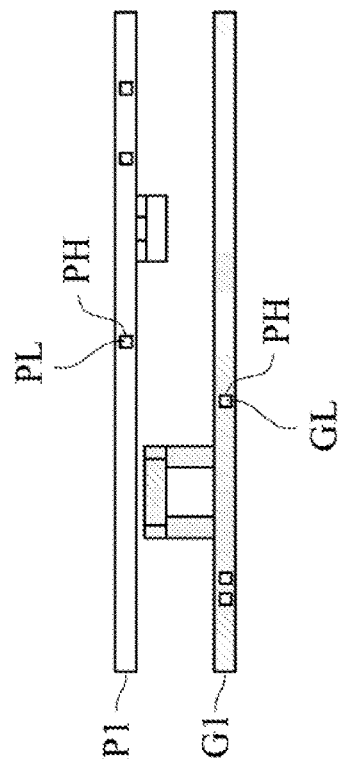
Fig. 3A
Fig. 3B

INTERPOSER ROUTING STRUCTURE AND SEMICONDUCTOR PACKAGE

CROSS-REFERENCE TO RELATED APPLICATION

This application claims priority to Taiwan Application Serial Number 112100517, filed Jan. 6, 2023, which is herein incorporated by reference in its entirety.

BACKGROUND

Technical Field

The present disclosure relates to a semiconductor device, in particular to an interposer routing structure and semiconductor package.

Description of Related Art

In recent years, with the vigorous development of semiconductor manufacturing process, the design of integrated circuit (IC) is becoming more and more sophisticated and complex. In the packaging structure of integrated circuits, different semiconductor dies are coupled to each other by an "interposer layer." However, due to the high wiring density inside the interposer layer, signal transmission of the interposer layer is prone to problems such as signal loss and signal crosstalk.

SUMMARY

One aspect of the present disclosure is an interposer routing structure, comprising a first trace layer, a bump layer, a second trace layer and a third trace layer. The first trace layer comprises a first ground trace and a first power trace. The first trace layer is configured to receive a power. The bump layer is coupled to a die. The second trace layer is coupled to the first ground trace and the first power trace, and comprises a plurality of second ground traces, a plurality of second power traces and at least one connecting power trace. The plurality of second ground traces are located on both sides of the plurality of second power traces, so that the plurality of second ground traces isolate the plurality of signal traces in the second trace layer. The plurality of second power traces are coupled to each other by the at least one connecting power trace. The third trace layer is coupled to the first ground trace and the first power trace, and comprises a plurality of third ground traces, at least one third power trace, a plurality of connecting ground traces and a plurality of branch ground traces. The plurality of third ground traces are located on both sides of the at least one third power trace, so that the plurality of third ground traces isolate the at least one third power trace from a plurality of signal traces in the third trace layer. The plurality of third ground traces are coupled to each other by the plurality of connecting ground traces, and the plurality of branch ground traces are located on both sides of the plurality of signal traces in the third trace layer.

Another aspect of the present disclosure is a semiconductor package, comprising at least one die, a substrate and an interposer layer. The substrate is configured to receive a power, and is coupled to a ground potential. The interposer layer is coupled between the substrate and the at least one die, and comprises a first trace layer, a second trace layer and a third trace layer. The first trace layer comprises a first ground trace and a first power trace, so as to coupled to the substrate. The second trace layer is coupled to the first trace layer, and comprises a plurality of second ground traces, a plurality of second power traces and at least one connecting power trace. The plurality of second ground traces are located on both sides of the plurality of second power traces, so that the plurality of second ground traces isolate the plurality of second power traces from a plurality of signal traces in the second trace layer. The plurality of second power traces are coupled to each other by the at least one connecting power trace. The third trace layer is coupled to the first trace layer, and comprises a plurality of third ground traces, at least one third power trace, a plurality of connecting ground traces and a plurality of branch ground traces. The plurality of third ground traces are located on both sides of the at least one third power trace, so that the plurality of third ground traces isolate the at least one third power trace from a plurality of signal traces in the third trace layer. The plurality of third ground traces are coupled to each other by the plurality of connecting ground traces, and the plurality of branch ground traces are located on both sides of the plurality of signal traces in the third trace layer.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows:

FIGS. 2A-2D are schematic diagrams of an interposer routing structure in some embodiments of the present disclosure.

FIGS. 3A-3D are schematic diagrams of an interposer routing structure in some embodiments of the present disclosure.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected" or "coupled", it may mean "electrically connected" or "electrically coupled". "Connected" or "coupled" may also be used to indicate that two or more elements cooperate or interact with each other. In addition, although terms such as "first" and "second" are used herein to describe different elements, these terms are only used to distinguish elements or operations described with similar technical terms. Unless clearly indicated by the description, these terms do not imply any particular order or sequence, nor are they intended to be limiting of the present disclosure.

Figure 1:
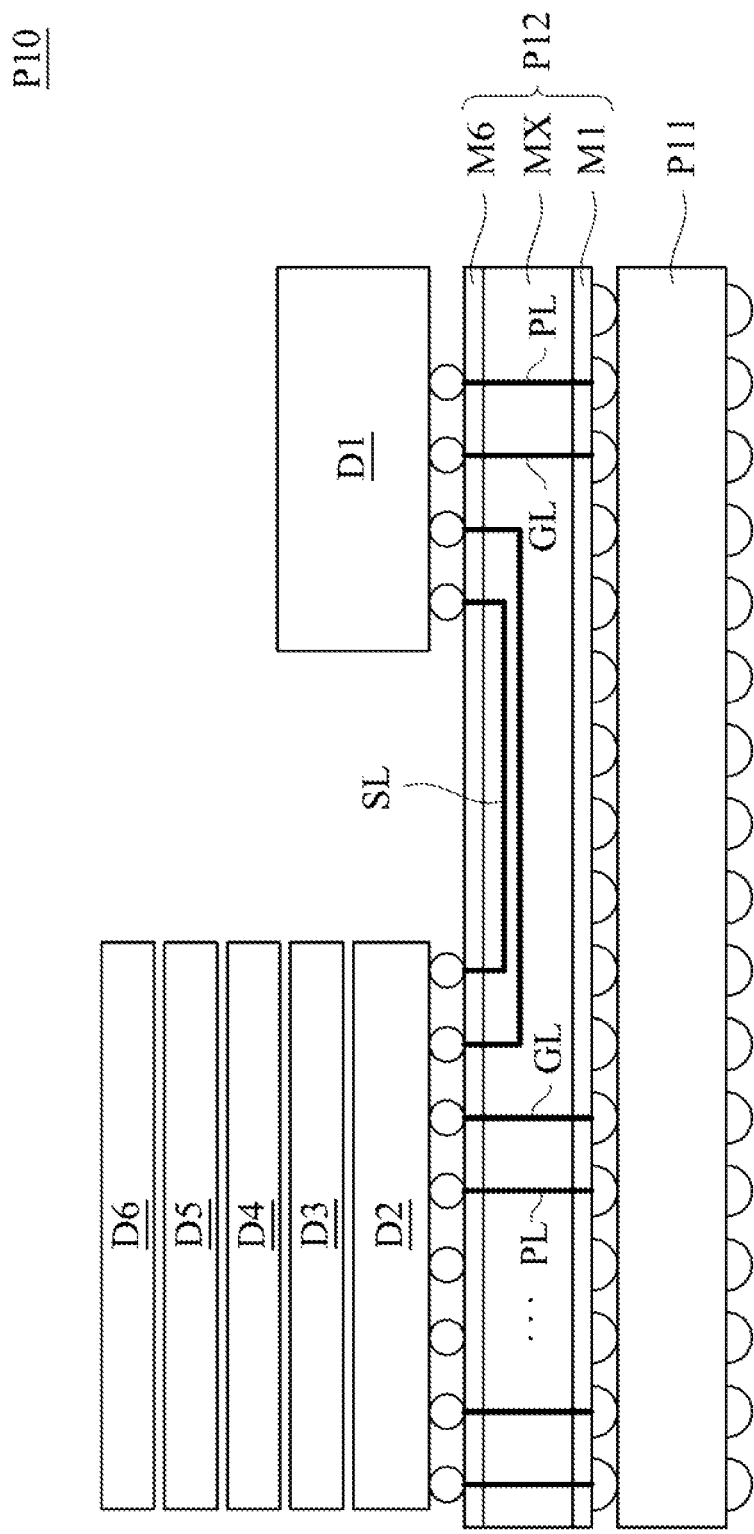
FIG. 1 is a schematic diagram of a semiconductor package in some embodiments of the present disclosure.

FIG. 1 is a schematic diagram of a semiconductor package P10 in some embodiments of the present disclosure. The semiconductor package P10 include at least one die, a substrate P11 and an interposer layer P12 (e.g., silicon-interposer). In this embodiment, the semiconductor package P10 include multiple dies D1-D6.

In some embodiments, structure of the semiconductor package P10 can be a high bandwidth memory (HBM). In other words, dies in the semiconductor package P10 are stacked vertically. For example, the die D1 in the semiconductor package P10 can be a main chip, and the dies D2-D5 are stacked on the interposer layer P12. The dies D2-D5 can be a static random access memory (SRAM). With the stacking configuration, a transmission path between the dies D2-D5 and the die D1 can be shortened to obtain better transmission efficiency and lower power.

The substrate P11 is configured to receive power, and is coupled to a ground potential. In one embodiment, the substrate P11 can be a printed circuit board, coupled to a power supply circuit and the ground potential.

The interposer layer P12 is coupled between the substrate P11 and the dies D1/D2, and is configured to provide power to the dies D1-D6. The interposer layer P12 has multiple signal traces SL, a power transmission trace PL and a ground transmission trace GL. The signal traces SL are configured to couple to the die D1 and the die D2 for data transmission. The power transmission trace PL pass through and couples to the interposer layer P12, so as to transmit power. The ground transmission trace GL pass through and couples to the interposer layer P12, so as to couple to ground potential in the substrate P11.

Specifically, a routing structure of the interposer layer P12 includes at least one trace layer and a bump layer M6. In one embodiment, the interposer layer P12 includes multiple trace layers M1-M6. The first trace layer M1 is couple to the substrate P11, so as to receive and transmit power. Each of the trace layers M2-M5 respectively has multiple signal traces SL for data transmission. The bump layer M6 is a top layer of the interposer layer P12 for coupling to the die D1, D2. For the convenience of explanation, the trace layers M2-M5 are referred to as a transmission layer MX here. In other words, the transmission layer MX is arranged between the first trace layer M1 and the bump layer M6 to transmit power to the die through multiple contacts (e.g., uBump) in the bump layer M6.

FIGS. 2A-2D are structural design schematic diagrams (Mesh Design) of routing of different layers in the interposer layer P12. In some embodiments, the transmission layer MX include a second trace layer M2, a third trace layer M3, a fourth trace layer M4 and a fifth trace layer M5. However, the present disclosure is not limited thereto, and the transmission layer MX may also have only one trace layer.

In addition, it should be mentioned that, in the embodiment shown in FIGS. 2A-2D, the routing structure of each trace layers M2-M5 in the transmission layer MX can be different, and the routing structure of each trace layers M2-M5 can be replaced with each other. For example, the routing structure of the second trace layer M2 and the third trace layer M3 described in the following paragraphs can be replaced with each other. Similarly, routing structure of the trace layers M2-M5 can also be the same, for example, the routing structure of the fourth trace layer M3 can be configured to be the same as the second trace layer M2 or the third trace layer M3.

Figure 2A:
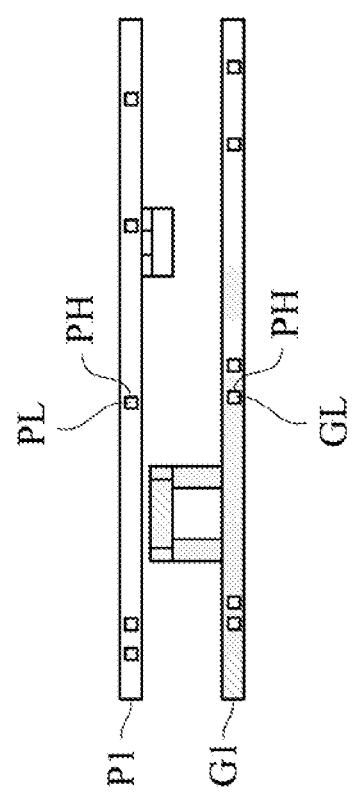

As shown in FIG. 2A, the first trace layer M1 include a first ground trace G1 and a first power trace P1. The first ground trace G1 is coupled to ground potential of the substrate P11 by the ground transmission trace GL, and the first power trace P1 is coupled to a power supply terminal of the substrate P11 by the power transmission trace PL.

Figure 2B:
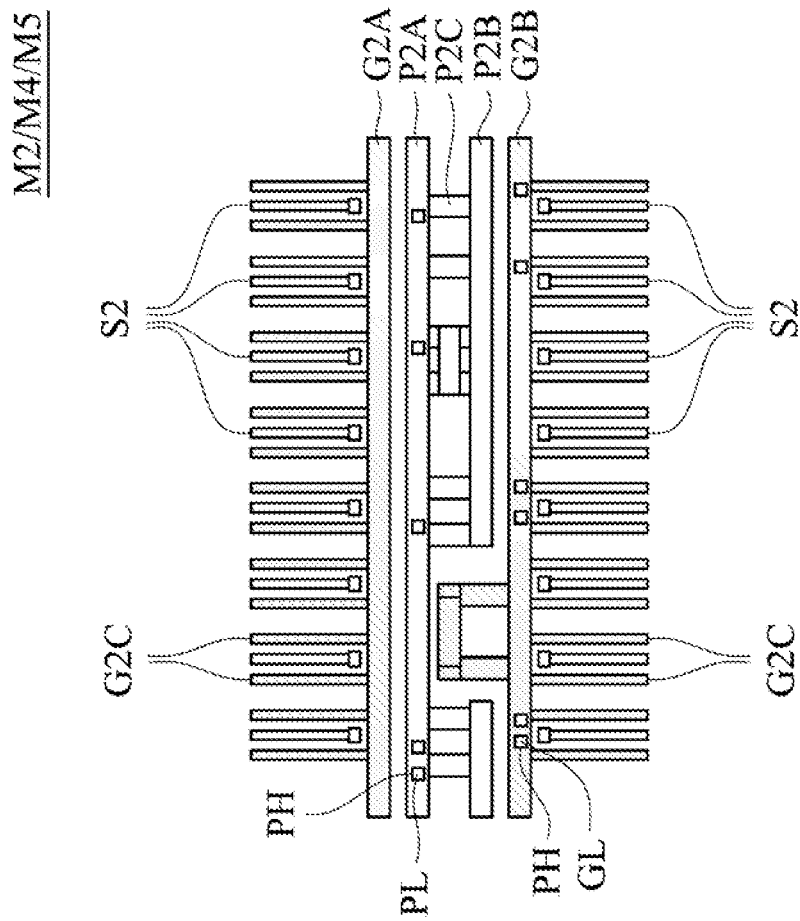

FIG. 2B is a schematic diagram of a routing structure of the second trace layer M2, the fourth trace layer M4 and the fifth trace layer M5. In this embodiment, the routing structure of the second trace layer M2, the fourth trace layer M4 and the fifth trace layer M5 are substantially the same, so the second trace layer M2 is used as an example for illustration here.

The second trace layer M2 include at least two second ground traces G2A, G2B and at least one second power trace (this embodiment includes multiple second power traces P2A, P2B). The second ground traces G2A, G2B are located on both sides of the second power trace P2A, P2B, so that the second ground traces G2A, G2B isolate the second power traces P2A, P2B from "the signal traces S2 in the second trace layer M2."

Specifically, as shown in FIG. 2B, the second ground trace G2A, G2B and the second power trace P2A, P2B in the second trace layer M2 are extended and arranged along the same direction (such as in a horizontal direction in FIG. 2B). The signal traces S2 are extended and arranged along the other direction (such as a vertical direction in FIG. 2B). Since all second power traces P2A, P2B are located between the second ground traces G2A, G2B, so the second ground traces G2A, G2B can be used as an isolation barrier, so as to isolate the second power traces P2A, P2B from the signal traces S2.

In the routing structure shown in FIG. 2B, the arrangement of the second ground traces G2A, G2B and the second power traces P2A, P2B from top to bottom is "G2A, P2A, P2B, G2B." With the routing structure of "setting power traces between ground traces", the noise in the second power traces P2A and P2B can be shielded to ensure the signal integrity of the signal traces S2.

On the other hand, in addition to ensuring noise shielding, the above routing structure of "setting power traces between ground traces" can also shorten return path between traces. As shown in FIG. 2B, since the second ground trace G2A is located between the second power trace P2A and the signal traces S2, a distance from the signal traces S2 to the second ground trace G2A is less than a distance from the signal traces S2 to the second power trace P2A. Similarly, in this embodiment, since the routing structure of the fourth trace layer M4 and the fifth trace layer M5 is the same as the routing structure of the third trace layer M3, for the fourth trace layer M4 and the fifth trace layer M5, a distance from the signal traces to the ground trace is also less than a distance from the signal traces to the power trace.

In one embodiment, the second trace layer M2 further includes multiple branch ground traces G2C. Extension direction or setting direction of the branch ground traces G2C is the same as the signal traces S2, and each of the branch ground traces G2C is respectively located on both sides of the corresponding signal trace S2. Specifically, one terminal of each of the branch ground traces G2C couple to one of ground traces (G2A or G2B), and other terminal of each of the branch ground traces G2C extends radially away from the second ground trace G2A (or G2B). Therefore, on a plane formed by the second trace layer M2, one terminal and both sides of each of the signal traces S2 will be surrounded by the second ground trace G2A (or G2B) and the branch ground traces G2C, so that the signal traces S2 are isolated from the second power traces P2A, P2B.

In some embodiments, the signal traces S2 and the branch ground traces G2C are arranged along the first direction (e.g., the vertical direction shown in FIG. 2B). The second ground traces G2A, G2B and the second power traces P2A, P2B are arranged along the second direction (e.g., the horizontal direction shown in FIG. 2B). The first direction and the second direction are perpendicular to each other.

In this embodiment, the second trace layer M2 further includes at least one connecting power trace P2C. The connecting power trace P2C is coupled to multiple second power traces P2A, P2B, so as to ensure that power can be completely supplied to each of the power transmission traces PL.

FIG. 2C is a schematic diagram of a routing structure of the third trace layer M3 in some embodiments of the present disclosure. The third trace layer M3 include multiple third ground traces G3A, G3B and at least one third power trace (this embodiment includes multiple third power traces P3A, P3B). The third ground traces G3A, G3B are located on both sides of the third power traces P3A, P3B, so that the third ground traces G3A, G3B isolate the third power traces P3A, P3B from "signal traces S3 in the third trace layer M3."

As shown in FIG. 2C, in this embodiment, the third trace layer M3 has multiple branch ground traces G3C. Extension direction or setting direction of the branch ground traces G3C is the same as the signal traces S3, and each of the branch ground traces G3C is respectively located on both sides of the signal traces S3. The third ground trace G3A (or G3B) and the branch ground traces G3C are respectively located on a side of each or multiple signal traces S3, so as to isolate the signal traces S3 from the third power traces P3A, P3B.

In addition, in this embodiment, the third trace layer M3 further includes at least one connecting ground trace G3D (this embodiment includes multiple connecting ground traces G3D). The connecting ground traces G3D are coupled to multiple third ground traces G3A, G3B. Furthermore, the connecting ground traces G3D and the third ground traces G3A, G3B can surround at least one third power trace in the third trace layer M3, so as to make the shielding effect of the third trace layer M3 more complete.

In the above embodiment, the routing structure of the third trace layer M3 is different from the routing structure of other trace layers M2/M4/M5, especially the third trace layer M3 has more the connecting ground traces G3D. In other words, in the second trace layer M2, multiple second ground traces G2A, G2B are not coupled to each other, and multiple second power traces P2A, P2B are coupled to each other by the connecting power trace P2C, so as to ensure that power can be completely supplied to each of the power transmission traces PL. On the other hand, in the third trace layer M3, multiple third ground traces G3A and G3B are coupled to each other by the connecting ground traces G3D to improve the shielding effect, but the multiple third power traces P3A, P3B are not coupled to each other in the third trace layer M3.

The routing structure of this present disclosure is not limited to FIGS. 2A-2C. In some embodiments, the routing structure of one or multiple of trace layers M2/M4/M5 can be changed to be the same as the routing structure of the third trace layer M3. Similarly, the routing structure of the third trace layer M3 can also be replaced with the routing structure of one or multiple of trace layers M2/M4/M5 (e.g., the routing structure of the second trace layer M2 and the third trace layer M3 are interchanged).

As shown in FIG. 1 and FIGS. 2A-2C, in one embodiment, corresponding positions of each layer of the interposer layer P12 has holes (conductive via) PH for setting multiple power transmission traces PL and multiple ground transmission traces GL. In other words, the power transmission traces PL and the ground transmission traces GL passing through and coupled to each layer of the interposer layer P12 through multiple conductive positions. Therefore, the power transmission traces PL pass through and couples to the interposer layer P12 (or the transmission layer MX), and also couples to each trace layer M2-M5. The power transmission traces PL are respectively couples to the first power trace P1 of the first trace layer M1, at least one part of the power traces in the transmission layer MX (e.g., the second power trace P2A/P2B, the third power trace P3A/P3B) and the bump layer M6. The ground transmission trace GL pass through and couples to each trace layer M2-M5 in the transmission layer MX, to respectively couple to the first ground trace G1 of the first trace layer M1, at least one part of the ground traces in the transmission layer MX parts (e.g., the second ground trace G2A/G2B, the third ground trace G3A/G3B) and the bump layer M6.

FIG. 2D is a schematic diagram of the bump layer M6 in some embodiments of the present disclosure. The bump layer M6 includes multiple power contacts TP, multiple ground contacts TG and multiple signal contacts TS. The power contacts TP are configured to couple to the die D1 (or the die D2) and the power transmission trace PL, so that power can be provided to the dies D1-D6 through the substrate P11 and the interposer layer P12. The ground contacts TG are coupled to the dies D1-D6 and the ground transmission trace GL, so that the dies D1-D6 conduct to the ground potential through the interposer layer P12 and the substrate P11. The signal contacts TS are coupled to the signal traces SL in the interposer layer P12, so that the dies D1-D6 can transmit data through the signal traces SL.

As shown in FIGS. 2A-2D, the routing structure of the transmission layer MX does not limit the arrangement of the contacts TP, TG, and TS in the bump layer M6. In other words, when the die design has a special requirement, and the contacts TP, TG, and TS in the bump layer M6 need to be specially arranged, the special requirement can be achieved by changing the position of the power transmission traces PL and the ground transmission traces GL couple to the transmission layer MX. Taking the second trace layer M2 as an example, a projection area of the ground contacts TG can be designed to "partially" overlap with a projection area of the second ground traces G2A, G2B, and with positions of the holes (conductive via) PH, the arrangement of the ground contact TG can be different from the arrangement of the second ground traces G2A, G2B.

For example, as shown in FIG. 2B and FIG. 2D, when the ground contacts TG in the bump layer M6 needs to be designed in the same row, Holes (conductive via) PH corresponding to the ground transmission traces GL in the second trace layer M2 will be arranged in the same second ground trace G2B, and the ground transmission traces GL is also couple to the same second ground trace G2B. In this case, in this case, the area of the second ground trace G2A, G2B is "two parallel rows", but holes (conductive via) PH are only arranged in one of the rows, that is, the second ground trace G2B (i.e., projection areas only partially overlaps).

Similarly, holes (conductive via) PH corresponding to the power transmission traces PL in the second trace layer M2 is arranged in the same second power trace P2A, and the power transmission traces PL are couple to the same second power trace P2A, so that the projection area of the power contacts TP overlap with the projection area of the second power traces P2A, P2B. Accordingly, by matching positions of holes (conductive via) PH, the arrangement of the power contacts TP and the ground contacts TG can be flexibly adjusted.

As shown in FIG. 2C and FIG. 2D, the arrangement of holes (conductive via) PH in the third trace layer M3 is the same as the second trace layer M2. The third ground traces G3A, G3B area is also "two parallel rows", but holes (conductive via) PH are only arranged in one of the rows, that is, the third ground trace G3B (i.e., projection areas only partially overlaps). Similarly, the projection area of the power contacts TP can be designed to only partially overlap with the projection area of the third power traces P3A, P3B.

In FIG. 2D, the alignment direction of the power contact TP and the ground contact TG are parallel to each other and arranged in two horizontal rows, but the present disclosure is not limited thereto. FIGS. 3A-3D are schematic diagrams of the routing structure of the interposer layer P12 in some embodiments of the present disclosure. In FIGS. 3A-3D, the similar components associated with the embodiment of FIGS. 2A-2D are labeled with the same numerals for ease of understanding. The specific principle of the similar component has been explained in detail in the previous paragraphs, and unless it has a cooperative relationship with the components of FIGS. 3A-3D, it is not repeated here.

As shown in FIGS. 3A-3D, except for the bump layer M6 and holes (conductive via) PH, the routing structure of the other layers of the interposer layer P12 is the same as the previous embodiment. By changing positions of holes (conductive via) PH, the arrangement of the power contacts TP and the ground contacts TG in the bump layer M6 can be flexibly designed without being affected by the arrangement of the power traces and the ground traces in the transmission layer MX. Specifically, in the FIG. 3D, the power contacts TP are arranged in two horizontal rows, and are located on a right side (take a direction of the FIG. 3D as an example). The ground contacts TG are also arranged in two horizontal rows, and are located on a left side. Therefore, holes (conductive via) PH are arranged on the left and right sides of the interposer layer P12, and the conductive positions (penetration positions) of the power transmission traces PL and the ground transmission traces GL will be located on the corresponding sides of the transmission layer MX (i.e., the left and right sides in FIGS. 3B-3C).

Figures 3C, 3D:
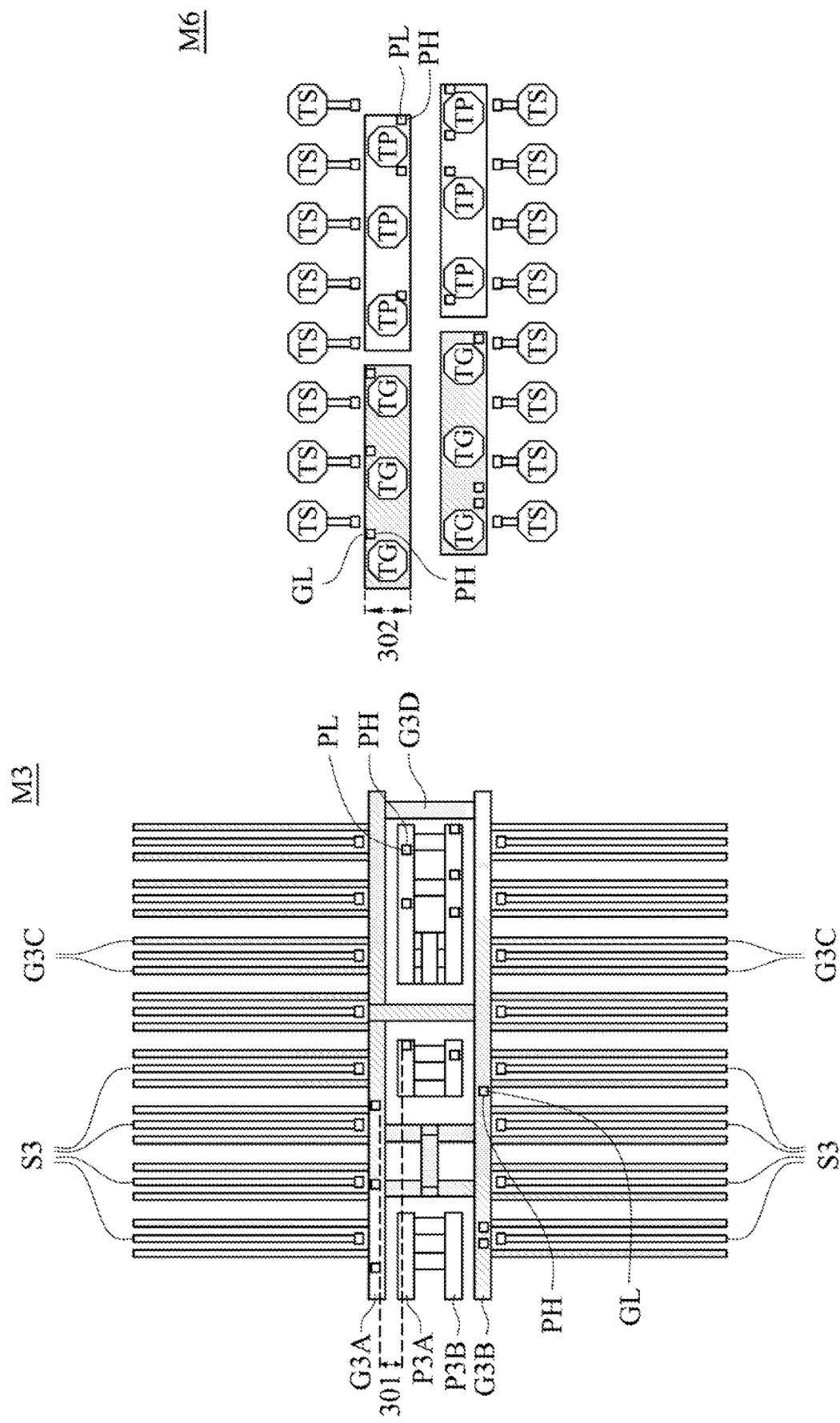

As shown in FIGS. 3C-3D, in the third trace layer M3, the signal traces SL and the branch ground traces G3C are arranged along a first direction, and there is a shortest linear distance 301 along the first direction between holes PH (or conductive positions) corresponding to the power transmission traces PL and the ground transmission traces GL in the third trace layer M3. The shortest linear distance 301 is equal to or less than a width 302 of the ground contacts TG in the first direction (i.e., the width of contacts). Accordingly, even if the third ground traces G3A, G3B and the third power traces P3A, P3B are not arranged in the same row in the third trace layer M3, part of the ground contacts TG and the power contacts TP can still be arranged in the same row in the bump layer M6.

FIGS. 4A-4D are schematic diagrams of the routing structure of the interposer layer P12 in other embodiments of the present disclosure. In FIGS. 4A-4D, the similar components associated with the embodiment of FIGS. 2A-2D are labeled with the same numerals for ease of understanding. The specific principle of the similar component has been explained in detail in the previous paragraphs, and unless it has a cooperative relationship with the components of FIGS. 3A-3D, it is not repeated here.

As shown in FIGS. 4A-4D, except for the bump layer M6 and holes (conductive via) PH, the routing structure of the other layers of the interposer layer P12 is the same as the previous embodiment. By changing positions of holes (conductive via) PH, the arrangement of the power contacts TP and the ground contacts TG in the bump layer M6 can be flexibly designed without being affected by the arrangement of the power traces and the ground traces in the transmission layer MX. Specifically, in the FIG. 4D, the power contacts TP and the ground contacts TG are alternately arranged. In other words, both sides of each or more of the power contacts TP are the ground contacts TG. Therefore, in the interposer layer P12, holes (conductive via) PH are alternately arranged. From a vertical direction (vertical direction of FIGS. 4B-4C), the power transmission traces PL are located between the ground transmission traces GL. From a horizontal direction (horizontal direction in FIGS. 4B-4C), the power transmission traces PL and the ground transmission traces GL are alternately arranged.

Figure 4B:
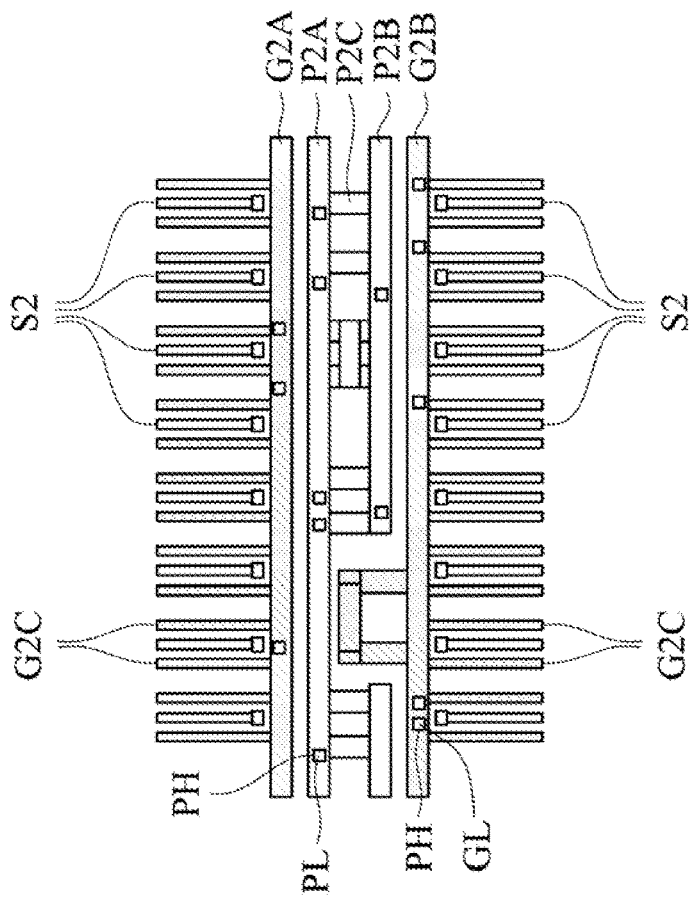
FIGS. 4A-4D are schematic diagrams of an interposer routing structure in some embodiments of the present disclosure.
Figure 4A:
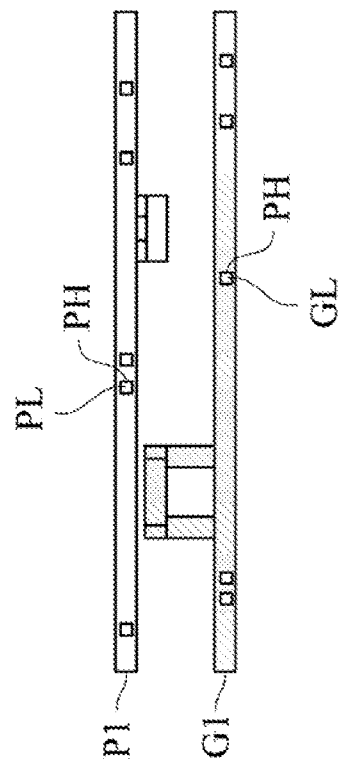
Figures 4C, 4D:
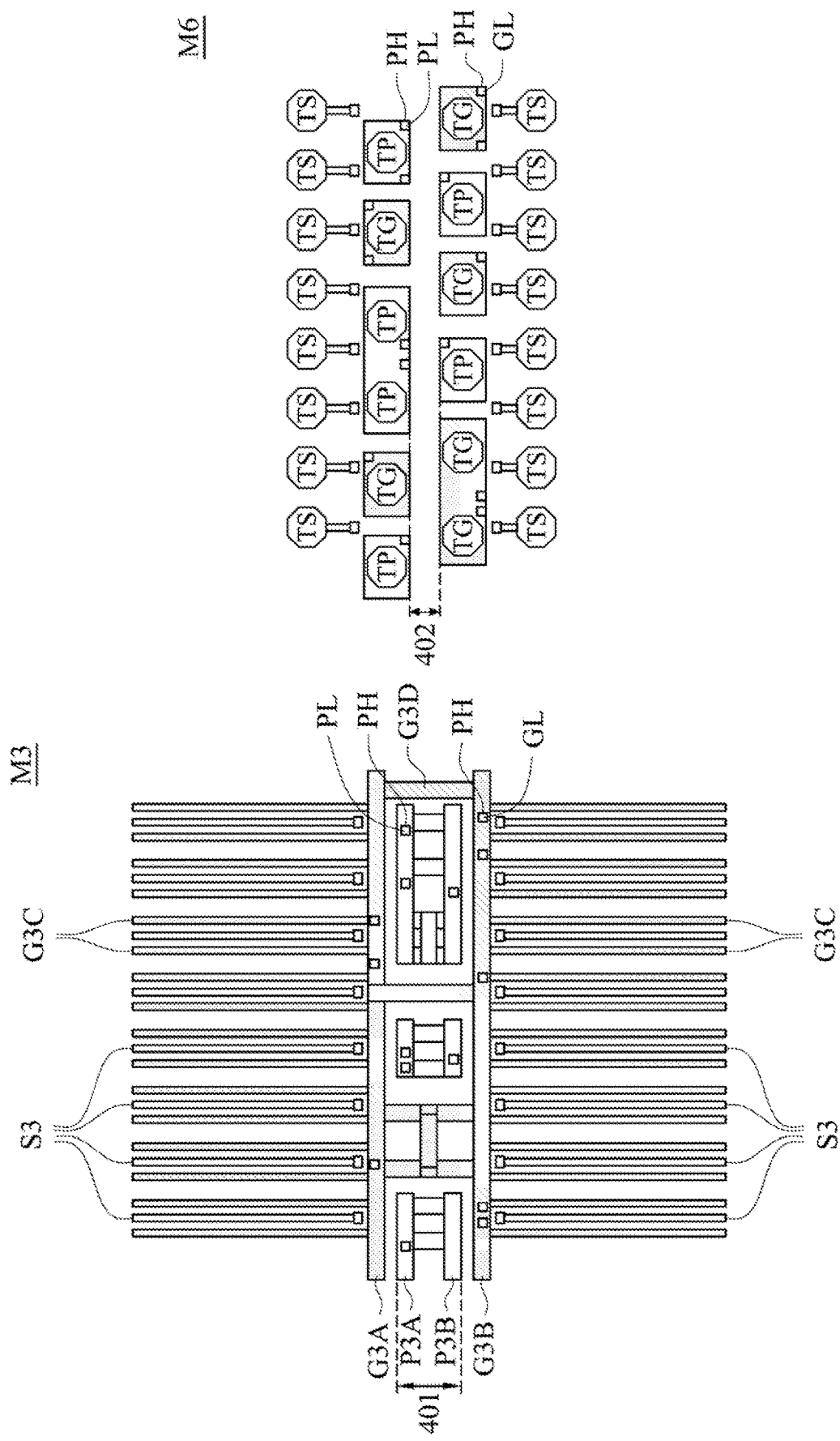

As shown in FIGS. 4C-4D, in the third trace layer M3, the signal traces SL and the branch ground traces G3C are arranged along the first direction. the third power traces P3A, P3B has a distribution width 401 in the first direction. The distribution width 401 is larger than or equal to a separation distance 402 of multiple power contacts TP in the bump layer M6 in the first direction. Accordingly, even if the third ground traces G3A, G3B and the third power traces P3A, P3B are not arranged along the first direction in the third trace layer M3, part of the power contacts TP can still be arranged along the first direction in the bump layer M6.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. An interposer routing structure, comprising:
  a first trace layer comprising a first ground trace and a first power trace, wherein the first trace layer is configured to receive power;
  a bump layer coupled to a die;
  a second trace layer coupled to the first ground trace and the first power trace, and comprising a plurality of second ground traces, a plurality of second power traces and at least one connecting power trace, wherein the plurality of second ground traces are located on both sides of the plurality of second power traces, so that the plurality of second ground traces isolate the plurality of second power traces from a plurality of signal traces in the second trace layer, and the plurality of second power traces are coupled to each other by the at least one connecting power trace; and
  a third trace layer coupled to the first ground trace and the first power trace, and comprising a plurality of third ground traces, at least one third power trace, a plurality of connecting ground traces and a plurality of branch ground traces, wherein the plurality of third ground traces are located on both sides of the at least one third power trace, so that the plurality of third ground traces isolate the at least one third power trace from a plurality of signal traces in the third trace layer; and wherein the plurality of third ground traces are coupled to each other by the plurality of connecting ground traces, and the plurality of branch ground traces are located on both sides of the plurality of signal traces in the third trace layer.

2. The interposer routing structure of claim 1, wherein one terminal of each of the plurality of branch ground traces is coupled to one of the plurality of third ground traces, and another terminal of each of the plurality of branch ground traces extends radially away from the plurality of third ground traces.

3. The interposer routing structure of claim 1, wherein the plurality of third ground traces and the plurality of connecting ground traces are configured to surround the at least one third power trace.

4. The interposer routing structure of claim 1, further comprising:
- a plurality of power transmission traces passing through and coupled to the second trace layer and the third trace layer to couple to the first power trace, the plurality of second power traces and the at least one third power trace; and
- a plurality of ground transmission traces passing through and coupled to the second trace layer and the third trace layer to couple to the first ground trace, the plurality of second ground traces and the plurality of third ground traces.

5. The interposer routing structure of claim 4, wherein the bump layer comprises:
- a plurality of power contacts coupled to the die and the plurality of power transmission traces; and
- a plurality of ground contacts coupled to the die and the plurality of ground transmission traces, wherein a projection area of the plurality of power contacts overlaps a projection area of the plurality of third ground traces.

6. The interposer routing structure of claim 5, wherein an alignment direction of the plurality of power contacts is parallel to an alignment direction of the plurality of ground contacts, or the plurality of power contacts and the plurality of ground contacts are alternately arranged.

7. The interposer routing structure of claim 5, wherein the plurality of ground transmission traces are coupled to a same one of the plurality of third ground traces.

8. The interposer routing structure of claim 5, wherein the plurality of signal traces and the plurality of branch ground traces in the third trace layer extend and arrange along a first direction, the plurality of power transmission traces and the plurality of ground transmission traces passing through and coupled to the third trace layer through a plurality of conductive positions, and a shortest linear distance of the plurality of conductive positions in the first direction is less than or equal to a width between the plurality of ground contacts in the first direction.

9. The interposer routing structure of claim 5, wherein the plurality of signal traces and the plurality of branch ground traces in the third trace layer extend and arrange along a first direction, and the at least one third power trace comprises a plurality of third power traces, a distribution width of the plurality of third power traces in the first direction is larger than or equal to a separation distance between the plurality of power contacts in the first direction.

10. The interposer routing structure of claim 1, further comprising:
- a fourth trace layer, wherein a routing structure of the fourth trace layer is the same as a routing structure of the second trace layer or the third trace layer.

11. A semiconductor package, comprising:
- at least one die;
- a substrate configured to receive power, and coupled to a ground potential; and
- an interposer layer coupled between the substrate and the at least one die, and comprising:
  - a first trace layer comprising a first ground trace and a first power trace, so as to coupled to the substrate;
  - a second trace layer coupled to the first trace layer, and comprising a plurality of second ground traces, a plurality of second power traces and at least one connecting power trace,
  - wherein the plurality of second ground traces are located on both sides of the plurality of second power traces, so that the plurality of second ground traces isolate the plurality of second power traces from a plurality of signal traces in the second trace layer, and the plurality of second power traces are coupled to each other by the at least one connecting power trace; and
  - a third trace layer coupled to the first trace layer, and comprising a plurality of third ground traces, at least one third power trace, a plurality of connecting ground traces and a plurality of branch ground traces, wherein the plurality of third ground traces are located on both sides of the at least one third power trace, so that the plurality of third ground traces isolate the at least one third power trace from a plurality of signal traces in the third trace layer; and
  - wherein the plurality of third ground traces are coupled to each other by the plurality of connecting ground traces, and the plurality of branch ground traces are located on both sides of the plurality of signal traces in the third trace layer.

12. The semiconductor package of claim 11, further comprising:
- a plurality of power transmission traces passing through and coupled to the interposer layer to couple to the first power trace, the plurality of second power traces and the at least one third power trace; and
- a plurality of ground transmission traces passing through and coupled to the interposer layer to couple to the first ground trace, the plurality of second ground traces and the plurality of third ground traces.

13. The semiconductor package of claim 12, wherein the interposer layer further comprises:
- a plurality of power contacts configured to couple to the at least one die; and
- a plurality of ground contacts configured to couple to the at least one die, wherein a projection area of the plurality of ground contacts overlaps a projection area of the plurality of third ground traces.

14. The semiconductor package of claim 13, wherein an alignment direction of the plurality of power contacts is parallel to an alignment direction of the plurality of ground contacts, or the plurality of power contacts and the plurality of ground contacts are alternately arranged.

15. The semiconductor package of claim 13, wherein the plurality of ground transmission traces are coupled to a same one of the plurality of third ground traces.

16. The semiconductor package of claim 13, wherein the plurality of signal traces and the plurality of branch ground traces in the third trace layer extend and arrange along a first direction, the plurality of power transmission traces and the plurality of ground transmission traces passing through and coupled to the third trace layer through a plurality of conductive positions, and a shortest linear distance of the plurality of conductive positions in the first direction is less than or equal to a width between the plurality of ground contacts in the first direction.

17. The semiconductor package of claim 13, wherein the plurality of signal traces and the plurality of branch ground traces in the third trace layer extend and arrange along a first direction, and the at least one third power trace comprises a plurality of third power traces, a distribution width of the plurality of third power traces in the first direction is larger than or equal to a separation distance between the plurality of power contacts in the first direction.

18. The semiconductor package of claim 11, wherein one terminal of each of the plurality of branch ground traces is coupled to one of the plurality of third ground traces, and an other terminal of each of the plurality of branch ground traces extends radially away from the plurality of third ground traces.

19. The semiconductor package of claim 11, wherein the plurality of third ground traces and the plurality of connecting ground traces are configured to surround the at least one third power trace.

20. The semiconductor package of claim 11, further comprising:
- a fourth trace layer, wherein a routing structure of the fourth trace layer is the same as a routing structure of the second trace layer or the third trace layer.

* * * * *